United States Patent [19]

Säkkä

[11] Patent Number: 5,420,552
[45] Date of Patent: May 30, 1995

[54] DEVICE AND METHOD FOR ADJUSTING A BANDPASS FILTER, ESPECIALLY A COMBINER FILTER

[75] Inventor: Veli-Matti Säkkä, Oulunsalo, Finland

[73] Assignee: Nokia Telecommunications Oy, Espoo, Finland

[21] Appl. No.: 146,199

[22] PCT Filed: May 8, 1992

[86] PCT No.: PCT/FI92/00148

§ 371 Date: Nov. 5, 1993

§ 102(e) Date: Dec. 17, 1993

[87] PCT Pub. No.: WO92/20149

PCT Pub. Date: Nov. 12, 1992

[30] Foreign Application Priority Data

May 9, 1991 [FI] Finland ................................ 912255

[51] Int. Cl.⁶ ............................................. H04B 1/04
[52] U.S. Cl. ...................................... 333/17.1; 455/125
[58] Field of Search ................ 333/17.1, 174; 455/123, 455/125

[56] References Cited

U.S. PATENT DOCUMENTS

| | | | |
|---|---|---|---|
| 3,715,690 | 2/1973 | Young et al. | 333/17.1 |
| 4,015,223 | 3/1977 | Cheze | 333/17.3 |
| 4,726,071 | 2/1988 | Jachowski | 455/125 |
| 4,951,009 | 8/1990 | Collins | 333/17.3 |
| 4,980,656 | 12/1990 | Duffalo et al. | 333/17.1 |
| 5,019,792 | 5/1991 | DiBiase et al. | 333/17.1 |
| 5,235,294 | 8/1993 | Ishikawa et al. | 333/17.1 |

*Primary Examiner*—Paul Gensler
*Attorney, Agent, or Firm*—Cushman Darby & Cushman

[57] ABSTRACT

A frequency adjustment method for an RF bandpass filter, especially a combiner filter, wherein the center frequency of the passband of the RF bandpass filter is adjusted in response to the RF power reflected from the input of the bandpass filter or passed through the bandpass filter. A sample signal proportional to the RF power reflected from the input of the bandpass filter or passed through the bandpass filter is mixed with a signal of substantially the transmitting frequency. The mixing result is lowpass-filtered and the bandpass filter is adjusted in response to the lowpass-filtered mixing result.

16 Claims, 2 Drawing Sheets

DEVICE AND METHOD FOR ADJUSTING A BANDPASS FILTER, ESPECIALLY A COMBINER FILTER

FIELD OF THE INVENTION

The invention relates to a frequency adjustment method for an RF bandpass filter, especially a combiner filter, wherein the center frequency of the passband of the RF bandpass filter is adjusted in response to the RF power reflected from the input of the bandpass filter or passed through the bandpass filter.

BACKGROUND OF THE INVENTION

One known way of connecting several radio transmitters to the same antenna or antenna line is to connect each radio transmitter through a separate bandpass filter having its center frequency tuned to the transmitting frequency of the radio transmitter. Such bandpass filters are called combiner filters. The function of the combiner filter is to feed the transmitting signal of the respective radio transmitter to the antenna with the smallest possible losses and prevent The entrance of transmitting signals of different frequencies from other radio transmitters in the direction of the antenna to this particular radio Transmitter as efficiently as possible. Conventionally, combiner bandpass filters are tuned fixedly to the transmitting frequencies of the radio transmitters. So it has not been possible to change the transmitting frequency of the radio transmitter without simultaneously changing the combiner filter or its tuning.

In certain cases, however, it is desirable that the frequencies of radio transmitters can be changed simply and rapidly. One such case is the base station of a cellular mobile radio system to which predetermined transmitting and receiving channels have been assigned. If the channel allocation of the system can be altered by varying the transmitting and receiving frequencies of the base stations, the channel capacity of the system can be utilized in a flexible and efficient way in varying conditions. Therefore combiner filters have been developed in which the center frequency changes automatically with the transmitting frequency.

The adjustment of known automatically tunable combiner filters is based on the measurement of the RF power reflected from the input of the filter or the RF power passed through the combiner filter, and locking to a minimum/maximum value of the measured power. A problem with this adjustment method is the low adjusting accuracy and the narrow dynamic range. As the frequency selectivity of the entire system relies on the combiner filter, power signal components of other radio transmitters leaking from the output of the combiner filter to its input cause the minimum reflection suppression value of the reflection suppression measurement at the filter input to be about 7 dB, which results in a narrow dynamic range for the measurement. In The adjustment method based on the measurement of the power passed through the combiner filter, the measuring dynamics of the maximum power value also remains low for the same reasons as have been stated above. In addition, the automatically tunable combiner filter based on this prior art adjustment method does not allow variation in the relative power levels between the radio transmitter, that is, the "mutual dynamics" is almost 0 dB, as a change in the power level of one transmitter affects immediately the power measurement in the adjustment circuits of the combiner filters of the other radio transmitters, thus causing adjustment error.

SUMMARY OF THE INVENTION

The object of the invention is to provide a frequency adjustment method of a new type for RF bandpass filters, which can be applied in combiner bandpass filters to improve the accuracy and the dynamic range of the adjustment.

This is achieved by means of a method of the type described in the introduction, wherein a sample signal proportional to the RF power reflected from the input of the bandpass filter or passed through the bandpass filter is mixed with a signal of substantially the same frequency, the mixing result is lowpass-filtered, and the bandpass filter is adjusted in response to the lowpass-filtered mixing result.

The basic idea of the invention is to increase the frequency selectivity of the measurement of the RF power passed through the filter or the reflected RF power by mixing the RF measurement signal (the sample signal) with a signal having the same frequency, that is, a transmitting-frequency signal, thus obtaining a substantially zero-frequency signal; that is, a DC signal having a level proportional to the RF power reflected from the input or the RF power passed through the filter. Power components leaking from the transmitting frequencies of other radio transmitters appear in the mixing result, e.g. at a frequency of 300 kHz or at higher frequencies, which are filtered off in the lowpass filtration following the mixing. In this way, the invention provides a DC signal the level of which depends merely on the transmitting-frequency RF power component to be measured. Because the transmitting signals of other radio transmitters do not affect the frequency adjustment of the automatically tuneable filter according to the invention, the invention provides a considerable improvement in the adjusting accuracy of the combiner filter and in the power dynamics of the measurement. The above-mentioned "mutual dynamics" is also improved, because the mutual power levels of the radio transmitters can be varied without affecting the adjustment of the combiner filter in any way.

In the preferred embodiment of the invention, the "local oscillator signal" used in the mixing is derived directly from the transmitting signal of the radio transmitter, but the local oscillator signal can also be generated by means of an oscillator included in the adjustment circuit. In such a case, the desired transmitting frequency is instructed to the oscillator as channel data similar to that instructed to the radio transmitter itself. In this way a remote-controllable frequency adjustment of a very high accuracy can be obtained in the combiner filter, if desired.

The effect of external loads on the adjustment of the combiner filter can be reduced by employing the measurement the reacted RF power and the RF power passed through the filter simultaneously. This is based on the fact that different load situations have a different effect on these two quantities to be measured.

The invention also relates to a device for adjusting an RF bandpass filter, especially a combiner filter, comprising means for generating an RF sample signal proportional to the RF power reflected from the input of the bandpass filter or passed through the bandpass filter; and adjusting means for adjusting the center frequency of the band-pass filter in response to the level of said sample signal. The device according to the invention further comprises mixing means for mixing the RF sample signal with a signal of substantially the same frequency; a lowpass filter connected to the output of the mixing means; and wherein the adjusting means is responsive to the level of the output signal of the lowpass filter for adjusting the bandpass filter.

BRIEF DESCRIPTION OF THE DRAWINGS

In the following the invention will be described by means of illustrating embodiments with reference to the attached drawings, in which.

DETAILED DESCRIPTION OF THE PREFERRED EMBODIMENTS OF THE INVENTION

Figure 1:
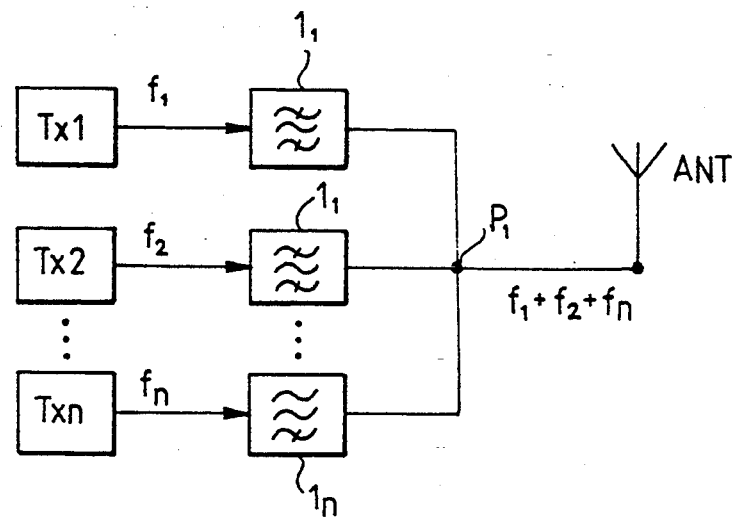
FIG. 1 is a block diagram illustrating a typical transmitter system utilizing combiner filters.

Referring to FIG. 1, n radio transmitters $T \times 1 \ldots T \times n$ having transmitting frequencies $f_1 \ldots f_n$, respectively, are connected through bandpass filters $1_1, 1_2, \ldots 1_n$ tuned to the respective frequencies, and then to a common summing point P1 and further through an antenna line to a common transmitting antenna ANT. So a radio-frequency (RF) signal applied to the transmitting antenna ANT comprises the frequencies $f_1 \ldots f_n$ of all the transmitters. The transmitting frequencies $f_1 \ldots f_n$ are within the range 920-960 MHz, for instance. Such bandpass filters connecting several transmitters to a common antenna are generally referred to as combiner filters. The invention will be described below in connection with combiner filters, in which it can be particularly advantageously applied, but the invention can also be applied in filters intended for other purposes when frequency selective power measurement is required in the frequency adjustment.

Figure 2:
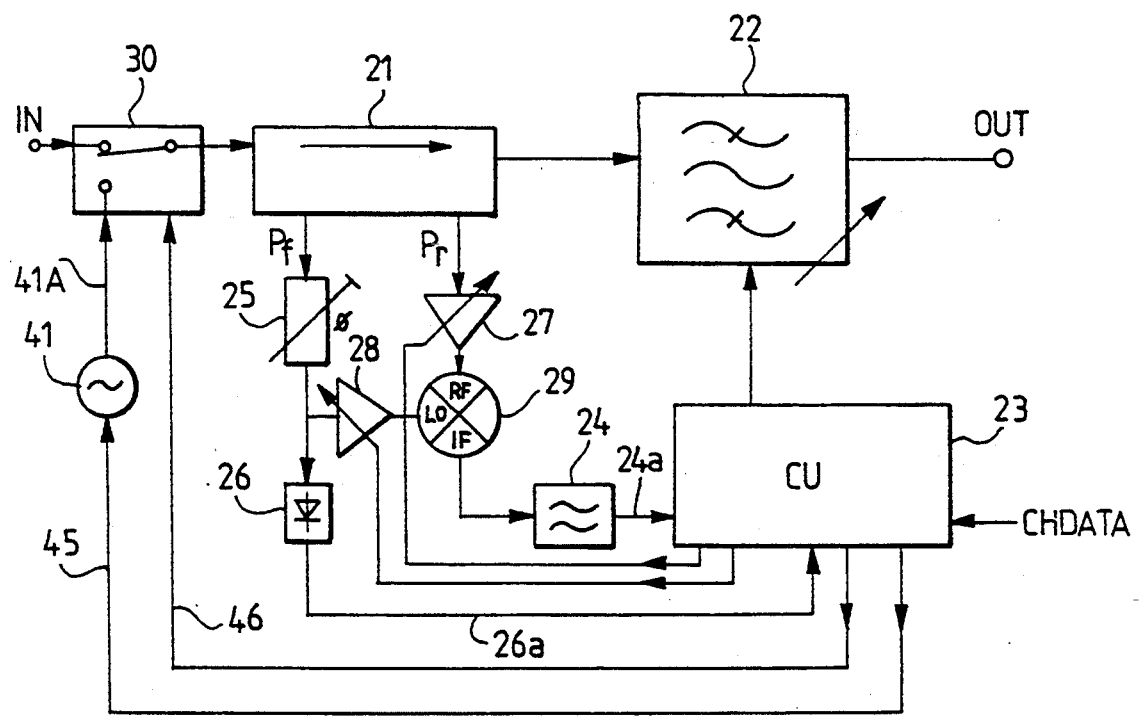
FIG. 2 is a block diagram illustrating a bandpass filter adjusting circuit according to the invention in which power reflected from the input of the filter is measured.

FIG. 2 shows a combiner filter utilizing the measurement of reflected power. The transmitting-frequency RF signal applied from the radio transmitter to an input IN is applied through a change-over switching device 30, a directional coupler device 21 or the like, to a bandpass filter 22 and further to an output OUT in the bandpass filter. The output OUT may be connected, e.g., to the antenna summing point P1 of the type shown in FIG. 1. The bandpass filter 22 is a narrow-band filter with a center frequency which is attempted to be adjusted as close as possible to the frequency of the transmitting carrier of the radio transmitter so that the signal to be transmitted is transferred to the antenna ANT with the smallest possible losses. The center frequency of the bandpass filter 22 is adjusted in response to the power of the RF signal component reflected from the input of the bandpass filter 22 in such a way that the reflected power component is minimized. For this purpose, the directional coupler device 21 derives a sample signal Pr from the signal component reflected from the input of the bandpass filter 22, the sample signal being proportional to the power of the signal component. The sample signal Pr is then applied to the input of a mixer 29 through an adjustable gain amplifier 27. The directional coupler device 21 also derives a sample signal Pf from the outbound signal applied to the input, and the sample signal Pf is applied to a local oscillator input LO of the mixer 29 through an adjustable phase shifting device 25 and an adjustable gain amplifier 28. A predetermined phase relation is set between the sample signals Pf and Pr by means of the manually adjustable phase shifting device 25, upon installing the filter. As the sample signals Pr and Pf are also equal in phase, the portion of the sample signal Pr proportional to the reflected power component appears in the mixing result present in the output IF of the mixer 29 as a substantially zero-frequency signal, i.e. as a DC signal. Power components leaked from other radio transmitters through the filter 22 to its input appear in the mixing result at a higher frequency, such as 300 kHz. The output signal of the mixer 29 is applied to an adjusting unit 23 through a lowpass filter 24, which filters he signal components of other radio transmitters from the mixing result. The level of the DC signal applied to the adjusting unit 23 is thus dependent merely on the amount of reflected transmitting-frequency power which provides accurate frequency adjustment insensitive to interferences. The adjusting unit 23 tends to adjust the center frequency of the bandpass filter 22 so that the level of the DC signal 24a is minimized.

The connection point between the adjustable phase shifter 25 and the adjustable amplifier 28 is connected to a power detector 26 which derives a dc voltage signal 26a from the sample signal Pf, the level of the dc voltage signal being proportional to the transmission power applied to the input IN. The adjusting unit 23 uses the signal 26a in the adjustment of the amplifiers 27 and 28 so that the dynamic ranges of the signals Pf and Pr applied to the mixer 29 and the output signal of the mixer 29 are optimal on each input power level. If desired, the power level information derived from the signal 26a can also be used as a reference value in the relative measurement of the level of the signal 24a.

The change-over switching device 30, which is controlled by the adjusting unit 23 by means of a control signal 46, may apply a transmitting-frequency local oscillator signal 41A to the directional coupler device 21 in place of the input signal IN. The local oscillator signal 41A is generated by a local oscillator 41 included in the adjustment circuit and controlled by an adjusting unit 23 by means of a control signal 45. The transmission channel used at each particular moment is instructed to the adjusting unit 23 by means of a signal CHDATA applied by the same control system that applies channel data to the radio transmitter itself. Upon receiving new channel data, the adjusting unit 23 applies the control signal 45 to the local oscillator 41 to cause it to assume a transmitting frequency corresponding to the new channel. The local oscillator signal is used in the absence of the actual transmission signal IN or when the combiner filter is to be tuned to the desired transmission channel by remote control. The use of the oscillator 41 improves the adjusting accuracy considerably in remote control operation. From the viewpoint of the operation of the adjusting circuit, the transmitting-frequency signal to be applied to the mixer may otherwise be derived from any source. Accordingly, the adjusting circuit may also be realized without the oscillator 41 or the oscillator may merely be used in the mixing procedure. In the last-mentioned case, the oscillator 41 may be connected directly to the mixer 29 and the switching device 30 may be omitted.

Figure 3:
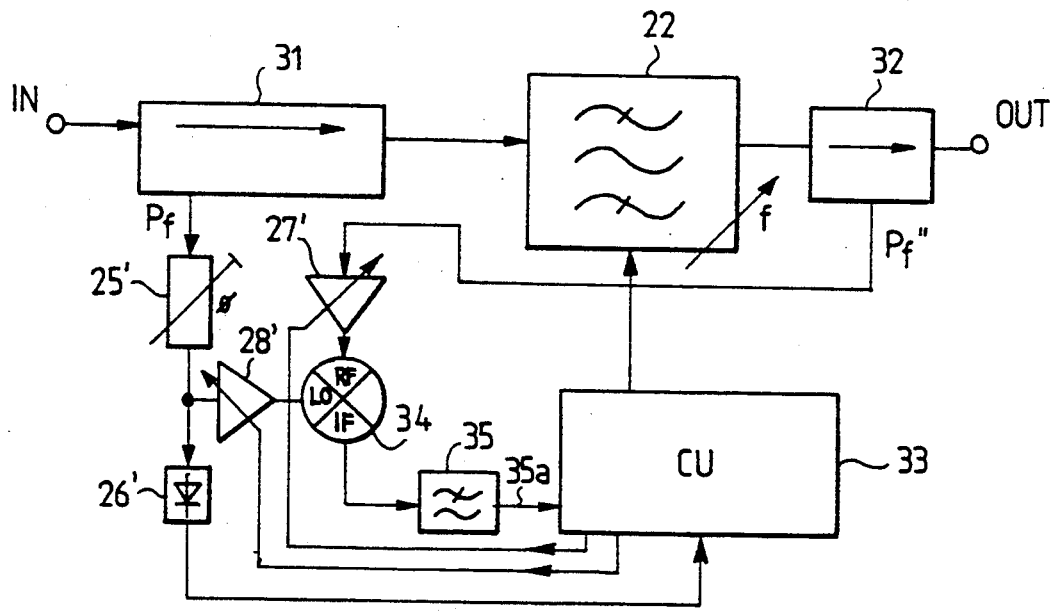
FIG. 3 is a block diagram illustrating a bandpass filter adjusting circuit according to the invention in which power massed through the filter is measured.

FIG. 3 shows an adjusting circuit according to the invention, in which the transmitting-frequency power passed through the bandpass filter 22 is measured. Components and blocks having the same operation and structure in FIGS. 2 and 3 are indicated by the same reference numerals. In the following, only the differences between FIGS. 2 and 3 will be described. A directional coupler 31 or the like derives a sample signal Pf from the inputted transmission power. Correspondingly, another directional coupler means 32 or the like is connected to the output of the filter 22 to derive a sample signal Pf'' from the output signal of the bandpass filter. The sample signal Pf'' is then applied through an adjustable gain amplifier 27' to the input RF of a mixer 34. Similarly as in FIG. 2, the mixer 34 mixes the transmitting-frequency sample signals Pf and Pf'', so that a mixing result is obtained in the output IF of the mixer 34, in which a signal component proportional to the transmitting-frequency signal power passed through the filter 22 appears as a substantially zero-frequency signal, that is, a DC signal. Any interfering components possibly caused by other radio transmitters appear at higher frequencies which are filtered off by a lowpass filter 35. So a DC signal 35a appears in the input of an adjusting unit 33, the level of the DC signal being dependent merely on the amount of transmitting-frequency power passed through the filter 22. The adjusting unit 33 adjusts the center frequency of the bandpass filter 22 so that the level of the signal 35a is at maximum.

Figure 4:
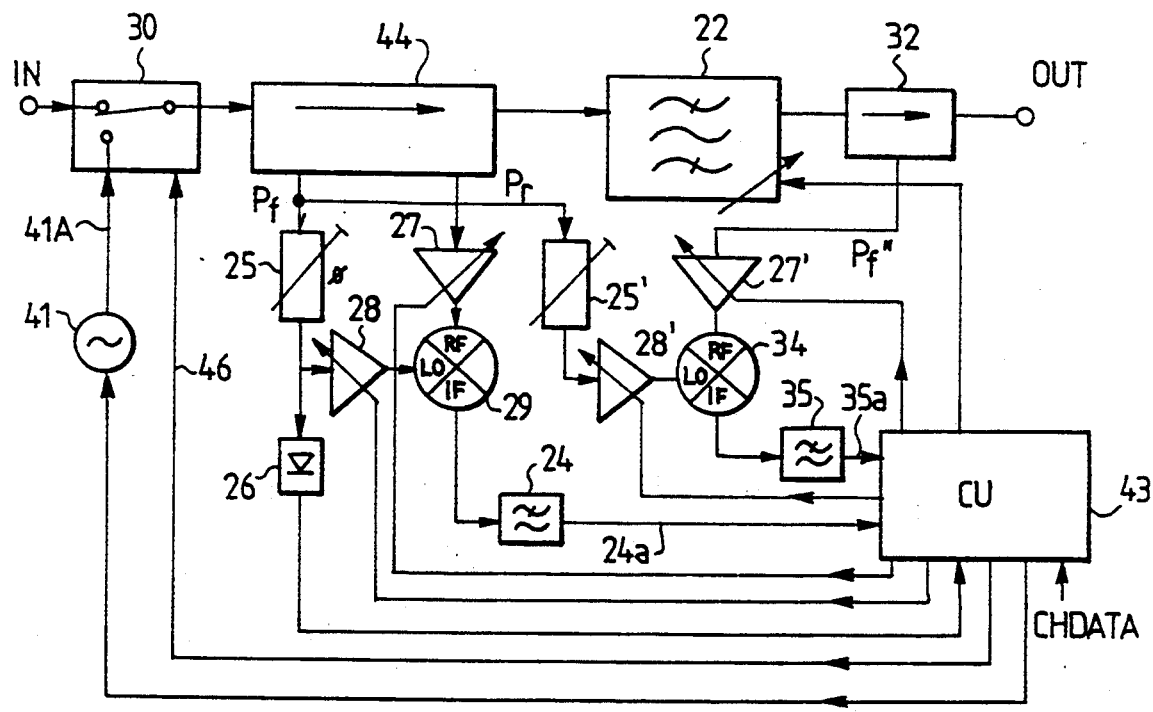
FIG. 4 is block diagram illustrating a bandpass filter adjusting circuit in which both reflected RF Dower and RF power passed through the filter are measured.

FIG. 4 shows still another bandpass filter frequency adjustment circuit according to the invention, in which measurement of both the reflected power and the power passed through the filter is employed. The circuit diagram of FIG. 4 is thus a combination of the circuit diagrams of FIGS. 2 and 3. A directional coupler means 44 derives a sample signal Pr from the reflected transmitting-frequency RF power reflected from the bandpass filter 22, and the sample signal Pr is then applied similarly as in FIG. 2 through the phase shifting device 25 and the adjustable amplifier 28 to the input RF of the mixer 29, and so the mixer 29 mixes the sample signal Pr with the transmitting-frequency signal applied to the local oscillator input LO, thus producing a mixing result in the output IF, in which the component corresponding to the reflected transmitting-frequency power is a substantially zero-frequency signal, that is a DC signal. This DC signal is filtered by the lowpass filter 24 so that a pure DC signal 24a is applied to the adjusting unit 43, the level of the signal 24a being dependent merely on the amount of transmitting-frequency power reflected from the input of the filter 22. Similarly as in FIG. 3, the directional coupler means 32 in the output of the bandpass filter 22 separates a sample signal Pf'' from the transmitting-frequency signal passed through the bandpass filter, and the sample signal Pf'' is applied through an adjustable amplifier 27' to the input RF of the mixer 34. The mixer 34 mixes the signal Pf'' with a transmitting-frequency signal applied to the local oscillator input LO, and so a mixing result appears in the output of the mixer 34, in which a substantially zero-frequency signal, that is, a DC signal corresponds to the signal Pf''. High frequencies are filtered off the mixing result by means of the lowpass filter 35a, so that a pure DC signal 35a having a level dependent merely on the amount of the transmitting-frequency power passed through the band-pass filter 22 is applied to the adjusting unit 43. Depending on the external load, the adjusting unit 43 adjusts the bandpass filter either in such a way that the level of the signal 35a is at maximum or in such a way that the level of the signal 24a is at minimum. The adjusting unit 43 applies a certain criterion to select the signal 24a or 35a to be used in the adjustment in each specific case. It is also possible that the adjusting unit 43 uses the signals 35a and 24a simultaneously in the adjustment, thus aiming at keeping them at predetermined values.

In FIG. 4, the transmitting-frequency local oscillator signal Pf is applied from the directional coupler 44 to the mixers 29 and 34 and through the phase shifting device 25 and the amplifier 28 and the phase shifting device 25' and the amplifier 28', respectively. The change-over switch 30 may connect either the transmitting signal or the local oscillator signal to the directional coupler 44.

The figures and the description related to them are only intended to illustrate the present invention. In their details, the method and the device according to the invention may vary within the scope of the attached claims.

I claim:

1. A method for adjusting the center frequency of the passband of an RF bandpass filter serving as a combiner filter, comprising:

applying RF power to an input of the bandpass filter and thereby causing a first portion of the RF power to be reflected from the input and a second portion to pass through the bandpass filter;

mixing a sample of said first portion or said second portion with a signal having substantially the same frequency as that of said sample, thereby providing a mixing result which is a DC signal;

lowpass-filtering said mixing result, thereby providing a lowpass-filtered mixing result;

adjusting the center frequency of the passband of said bandpass filter in response to said lowpass-filtered mixing result.

2. A method for adjusting the center frequency of the passband of an RF bandpass filter serving as a combiner filter, comprising:

applying RF power to an input of the bandpass filter and thereby causing a first portion of the RF power to be reflected from the input and a second portion to pass through the bandpass filter;

mixing a sample of said first portion with a signal having substantially the same frequency as that of said sample, thereby providing a mixing result which is a DC signal;

lowpass-filtering said mixing result, thereby providing a lowpass-filtered mixing result;

adjusting the center frequency of the passband of said bandpass filter in response to said lowpass-filtered mixing result, to minimize the level of said mixing result.

3. A method for adjusting the center frequency of the passband of an RF bandpass filter serving as a combiner filter, comprising:

applying RF power to an input of the bandpass filter and thereby causing a first portion of the RF power to be reflected from the input and a second portion to pass through the bandpass filter;

mixing a sample of said second portion with a signal having substantially the same frequency as that of said sample, thereby providing a mixing result;

lowpass-filtering said mixing result, thereby providing a lowpass-filtered mixing result;

adjusting the center frequency of the passband of said bandpass filter in response to said lowpass-filtered mixing result, to maximize the level of said mixing result.

4. The method of claim 3, wherein:
said mixing result is a DC signal.

5. A method for adjusting the center frequency of the passband of an RF bandpass filter serving as a combiner filter, comprising:
applying RF power to an input of the bandpass filter and thereby causing a first portion of the RF power to be reflected from the input and a second portion to pass through the bandpass filter;
mixing a sample of said first portion with a signal having substantially the same frequency as that of said sample of said first portion, thereby providing a first mixing result;
mixing a sample of said second portion with a signal having substantially the same frequency as that of said sample of said second portion, thereby providing a second mixing result;
lowpass-filtering said first and second mixing results, thereby providing first and second lowpass-filtered mixing results;
adjusting the center frequency of the passband of said bandpass filter in response to both said lowpass-filtered mixing results.

6. The method of claim 5, wherein:
said first and second mixing results are respective DC signals.

7. A device for adjusting the center frequency of the passband of an RF bandpass filter serving as a combiner filter, as RF power is applied to an input of the bandpass filter and thereby causes a first portion of the RF power to be reflected from the input and a second portion to pass through the bandpass filter,
said device comprising:
means for generating a sample of said first portion or said second portion;
an adjustable oscillator for generating a signal having substantially the same frequency as that of said sample;
means for mixing said sample with said signal having substantially the same frequency as that of said sample, thereby providing a mixing result;
means for lowpass-filtering said mixing result, thereby providing a lowpass-filtered mixing result; and
means for adjusting the center frequency of the passband of said bandpass filter in response to said lowpass-filtered mixing result.

8. The device of claim 7, further comprising:
a change-over switch for connecting an output signal of said adjustable oscillator as a local oscillator signal of said mixing means, so that said bandpass filter is remote-controllable to a desired channel.

9. A device for adjusting the center frequency of the passband of an RF bandpass filter serving as a combiner filter, as RF power is applied to an input of the bandpass filter and thereby causes a first portion of the RF power to be reflected from the input and a second portion to pass through the bandpass filter,
said device comprising:
first means for generating a sample of said first portion;
second means for generating a sample of said second portion;
means for generating a signal having substantially the same frequency as that of said first and second samples;
first means for mixing said first sample with said first signal having substantially the same frequency as that of said first and second samples, thereby providing a first mixing result;
second means for mixing said second sample with said second signal having substantially the same frequency as that of said first and second samples, thereby providing a second mixing result;
first means for lowpass-filtering said first mixing result, thereby providing a first lowpass-filtered mixing result;
second means for lowpass-filtering said second mixing result, thereby providing a second lowpass-filtered mixing result; and
means for adjusting the center frequency of the passband of said bandpass filter in response to said first and second lowpass-filtered mixing results.

10. The device of claim 9, wherein:
said means for generating a signal having substantially the same frequency as that of said first and second samples, comprises means for deriving that signal from said RF power applied to said input of said bandpass filter.

11. The device of claim 9, wherein:
said means for generating said first and second signals respectively having substantially the same frequency as that of said first sample and substantially the same frequency as that of said second sample, are respective adjustable oscillators.

12. The device of claim 11, further comprising:
a respective change-over switch for connecting an output signal of each said adjustable oscillator as a local oscillator signal of the respective said mixing means, so that said bandpass filter is remote-controllable to a desired channel.

13. A device for adjusting the center frequency of the passband of an RF bandpass filter serving as a combiner filter, as RF power is applied to an input of the bandpass filter and thereby causes a first portion of the RF power to be reflected from the input and a second portion to pass through the bandpass filter,
said device comprising:
means for generating a sample of said first portion or said second portion;
means for generating a signal having substantially the same frequency as that of said sample;
means for mixing said sample with said signal having substantially the same frequency as that of said sample, thereby providing a mixing result;
means for lowpass-filtering said mixing result, thereby providing a lowpass-filtered mixing result;
means for adjusting the center frequency of the passband of said bandpass filter in response to said lowpass-filtered mixing result;
means for generating a sample signal proportional to said RF power applied to said input of said bandpass filter;
first level-adjusting means for adjusting the level of sample of said portion;
second level-adjusting means for adjusting the level of said signal having substantially the same frequency as that of said sample of said portion; and
control means for controlling said first and second level-adjusting means in response to the level of said sample signal proportional to said RF power.

14. The device of claim 13, wherein:
said means for generating a signal having substantially the same frequency as that of said sample of said portion, comprises means for deriving that signal from said RF power applied to said input of said bandpass filter.

15. The device of claim 13, wherein:
said means for generating said signal having substantially the same frequency as that of said sample of said portion is an adjustable oscillator.

16. The device of claim 15, further comprising:
a change-over switch for connecting an output signal of said adjustable oscillator as a local oscillator signal of said mixing means, so that said bandpass filter is remote-controllable to a desired channel.

* * * * *

UNITED STATES PATENT AND TRADEMARK OFFICE
CERTIFICATE OF CORRECTION

PATENT NO. : 5,420,552

DATED : May 30, 1995

INVENTOR(S) : SÄRKKÄ, Veli-Matti

It is certified that error appears in the above-identified patent and that said Letters Patent is hereby corrected as shown below:

On the title page: Item

[75]  Inventor:  Veli-Matti Särkkä, Oulunsalo, Finland

Signed and Sealed this

Twenty-sixth Day of September, 1995

Attest:

BRUCE LEHMAN

Attesting Officer

Commissioner of Patents and Trademarks